United States Patent
Bryngelsson et al.

(10) Patent No.: US 11,614,490 B2
(45) Date of Patent: Mar. 28, 2023

(54) METHOD OF ESTIMATING A CHARGE STATE FOR A BATTERY CELL

(71) Applicant: VOLVO TRUCK CORPORATION, Gothenburg (SE)

(72) Inventors: Hanna Bryngelsson, Gothenburg (SE); Esteban Gelso, Gothenburg (SE)

(73) Assignee: VOLVO TRUCK CORPORATION, Gothenburg (SE)

(*) Notice: Subject to any disclaimer, the term of this patent is extended or adjusted under 35 U.S.C. 154(b) by 764 days.

(21) Appl. No.: 16/466,377

(22) PCT Filed: Dec. 6, 2016

(86) PCT No.: PCT/EP2016/079945
§ 371 (c)(1),
(2) Date: Jun. 4, 2019

(87) PCT Pub. No.: WO2018/103829
PCT Pub. Date: Jun. 14, 2018

(65) Prior Publication Data
US 2019/0339330 A1    Nov. 7, 2019

(51) Int. Cl.
*G01R 31/367*     (2019.01)
*G01R 31/374*     (2019.01)
*G01R 31/382*     (2019.01)
*B60L 58/12*      (2019.01)
*G01R 31/36*      (2020.01)

(52) U.S. Cl.
CPC ............ *G01R 31/367* (2019.01); *B60L 58/12* (2019.02); *G01R 31/374* (2019.01); *G01R 31/382* (2019.01); *B60Y 2200/91* (2013.01); *B60Y 2200/92* (2013.01); *G01R 31/3648* (2013.01)

(58) Field of Classification Search
CPC .. G01R 31/367; G01R 31/374; G01R 31/382; G01R 31/3648; B60L 58/12
See application file for complete search history.

(56) References Cited

U.S. PATENT DOCUMENTS

2009/0248334 A1    10/2009  Sans et al.
2009/0295397 A1*   12/2009  Barsukov ............ G01R 31/367
                                                       324/429
(Continued)

FOREIGN PATENT DOCUMENTS

CN    103020445 A    4/2013
CN    103197251 A    7/2013
(Continued)

OTHER PUBLICATIONS

Pei et al., "Development of a voltage relaxation model for rapid open-circuit voltage prediction in lithium-ion batteries" Journal of Power Sources 253 (2014) 412-418 (Year: 2014).*

(Continued)

*Primary Examiner* — John C Kuan
(74) *Attorney, Agent, or Firm* — Venable LLP; Jeffri A. Kaminski

(57) ABSTRACT

The present disclosure relates to a method of estimating a charge state for a battery cell, specifically taking into account different operational states (402, 404, 406, 408) of the battery cell. The present disclosure also relates to a battery management arrangement (200) and to a corresponding computer program product.

16 Claims, 4 Drawing Sheets

(56) References Cited

U.S. PATENT DOCUMENTS

| | | | |
|---|---|---|---|
| 2013/0138370 A1 | 5/2013 | Oh et al. |
| 2013/0166235 A1 | 6/2013 | Oh et al. |
| 2014/0244193 A1 | 8/2014 | Balasingam et al. |
| 2014/0244225 A1 | 8/2014 | Balasingam et al. |
| 2014/0333317 A1 | 11/2014 | Frost et al. |

FOREIGN PATENT DOCUMENTS

| | | | |
|---|---|---|---|
| CN | 104049215 A | 9/2014 |
| CN | 104049216 A | 9/2014 |
| CN | 105068008 A | 11/2015 |
| GB | 2537406 A | 10/2016 |
| JP | 3732465 B2 * | 1/2006 |
| JP | 2009236919 A | 10/2009 |
| JP | 2015132481 A | 7/2015 |

OTHER PUBLICATIONS

International Search Report and Written Opinion dated Aug. 8, 2017 in International Application No. PCT/EP2016/079945.
Korean Office Action dated Aug. 25, 2020 in corresponding Korean Patent Application No. 10-2019-7019733, 13 pages.
Chinese Office Action dated Apr. 29, 2022 in corresponding Chinese Patent Application No. 201680091374.6, 6 pages.

* cited by examiner

METHOD OF ESTIMATING A CHARGE STATE FOR A BATTERY CELL

TECHNICAL FIELD

The present disclosure relates to a method of estimating a charge state for a battery cell, specifically taking into account different operational states of the battery cell. The present disclosure also relates to a battery management arrangement and to a corresponding computer program product.

BACKGROUND

Recently, electric vehicles such as HEVs (hybrid electric vehicles) and PEVs (pure electric vehicles) have received a great amount of attention. Such vehicles comprise a battery that is used for driving an electric motor, in turn propelling the vehicle. Such vehicles may also comprise a regenerative braking system in which a brake force is converted to useful electrical energy for charging the battery. Accordingly, the battery comprised with such a vehicle will frequently transition between a charging and a discharging operational state.

An important parameter in the operation of vehicles that utilize batteries is the "state of charge" (SOC). The state of charge refers to the stored energy in the battery that is available to be used at any given time relative to the stored energy that is available when the battery is fully charged. An accurate determination of the state of charge allows the vehicles to maximize performance and efficiency while minimizing emissions. The SOC may be calculated for the battery as a whole and for each of a plurality of cells comprised with battery. The state of charge for each individual cell provides information that is useful for balancing the state of charge between the cells.

A conventional approach SOC calculation is to relate either a measured or calculated open circuit voltage to the state of charge. This is feasible because the open circuit voltage, which is the resting voltage of the battery when no load is applied, generally exhibits some observable dependence on the battery's state of charge An alternative approach to SOC calculation is disclosed in US20140244193. In accordance to US20140244193, a plurality of different operational states for the battery are determined, where each of the operational states are associated with an equivalent model for the battery that is used for SOC calculation. The operational state may be based on a load associated with the battery. For example, the operational state may be based on the voltage drop across the load or based on whether or not the voltage drop across the load is relatively high or low, relatively constant or dynamic.

Even though US20140244193 provides an interesting approach to SOC calculation and making the calculation more dynamic as compared to previous solutions, the solution presented in US20140244193 will typically be computational inefficient and thus slow. Accordingly, it would be desirable to provide further enhancements for improving the SOC calculation, specifically targeted towards computational efficiency suitable for an automotive implementation where the battery frequently will transition between different operational states for the battery.

SUMMARY

According to an aspect of the present disclosure, the above is at least partly alleviated by a computer implemented method of estimating a charge state for a battery cell comprised with a vehicle, the vehicle further comprising a battery management arrangement further comprising a control unit, the method comprising forming a first, a second and a third battery cell equivalent model for the battery cell, where the plurality of battery equivalent models relates to a first, a second and a third operational states for the battery cell, respectively, measuring an intermediate electrical current value of the battery cell, determining, by the control unit and based on the intermediate electrical current value, if the battery cell is in the first, the second or the third operational state for the battery cell, and estimating, by the control unit, the charge state for the battery cell based on the battery cell equivalent model corresponding to the determined operational state, wherein the method further comprises identifying, by the control unit, a transition between operational states, wherein an output parameter from a previously applied battery cell equivalent model for estimating the charge state is provided as an input parameter for a subsequently applied battery cell equivalent model for estimating the charge state, and wherein the first, the second and the third battery cell equivalent model corresponds to a charge battery equivalent model, a discharge battery cell equivalent model and a relaxation battery cell equivalent model, respectively.

Thus, in accordance to the present disclosure, once the control unit has identified that an operational state transition for the battery has happened, such as e.g. from a charging to a discharging operational state, a representative parameter (above defined as an output parameter) formed during the charge state estimation made when the battery is in the charging operational state, will be "forwarded" (above defined as an input parameter) for use during the charge state estimation made once the battery is in the discharging operational state. It should be understood that output parameter advantageously is a state variable generated during the charge state estimation as will be further elaborated below. The output variable may also include electrical voltage and current values for the battery cell or from calculations made in relation to the charge state estimation. In some possible embodiments the output parameter may be the estimated state charge.

An advantage with such functionality is the possibility to, in comparison to prior-art, quickly generating a relatively accurate charge state estimation for the battery once in the "next" operational state. This is because the charge state estimation performed using the (relevant) battery cell equivalent model for the battery cell will converge faster as compared to the case where a charge state estimation is made solely based on e.g. an intermediate electrical current value of the battery cell. Thus, the output/input parameter will accordingly reduce the time needed for performing the charge state estimation once in the transition has taken place and the battery is in the next operational state. As understood from the previous discussion, this will be advantageous in cases where the battery is expected to frequently transition between different operational state, such as for example in an automotive implementation.

In an embodiment of the present disclosure, the charge state is at least one of a state of charge (SOC) and a state of energy (SOE). SOC is the equivalent of a fuel gauge for the battery pack in an electric vehicle, typically presented in percentage points. SOE on the other hand is an integral result of battery power, which is the product of current and terminal voltage.

Preferably, the provision of the output parameter from the previously applied battery cell equivalent model, as the input parameter for the subsequently applied battery cell equivalent model may also provide for hysteresis in the transition between operational states. The hysteresis may preferably be adapted to have a predefined tolerance. An advantage with such an addition is the possibility of reducing influences, such as errors and noise, residual from e.g. a current sensor used for measuring the intermediate electrical current value of the battery cell. In addition, the hysteresis functionality may be used for ensuring that the switching between different battery cell equivalent models is refrained from when e.g. the intermediate electrical current level is within the (range) of the predefined tolerance (e.g. between $+\Delta I$ and $-\Delta I$). Accordingly, such an implementation will greatly reduce unwanted switching between the different battery cell equivalent models.

Preferably, there may also, additionally, be provided a fourth operational state for the battery cell and a corresponding fourth battery cell equivalent model, where the third operational state is a charge relaxation battery cell equivalent model and the fourth operational state is a discharge relaxation battery cell equivalent model. With the above-suggested implementation, a separate model is provided for each of the four most typical modes of operating the battery cell. In accordance to the present disclosure, the operational states are preferably arranged as a state machine, as will be further elaborated below. The output/input parameter will accordingly be forwarded between the different states (i.e. battery cell operational states) of the state machine.

In a typical implementation of the present disclosure, each of the plurality of battery equivalent models for the battery cell is represented by an electrical circuit model. Such a circuit model is preferably an RC based circuit model. In the detailed description below a further elaboration will be given in relation to the application of the RC based circuit model for charge state estimation for the battery cell.

In some implementations it may be beneficial to additionally take into account an estimated intermediate temperature of the battery cell (e.g. measured by a temperature sensor arranged in the vicinity of the battery cell), to be used in the charge state estimation. Such an inclusion, may in some situations, further enhance the reliability of the estimated charge state calculation process. In a specific embodiment of the present disclosure, this is achieved by determining a proportion rate based on the estimated charge state and the estimated temperature, and using the proportion rate in relation to the subsequently applied battery cell equivalent model for estimating the charge state.

According to another aspect of the present disclosure there is provided a battery management arrangement for a vehicle, comprising a control unit adapted to estimating a charge state for a battery cell, wherein the control unit is configured to form a first, a second and a third battery cell equivalent model for the battery cell, where the plurality of battery equivalent models relates to a first, a second and a third operational states for the battery cell, respectively, measure an intermediate electrical current value of the battery cell, determine, based on the intermediate electrical current value, if the battery cell is in the first, the second or the third operational state for the battery cell, and estimate the charge state for the battery cell based on the battery cell equivalent model corresponding to the determined operational state, wherein the control unit is further configured to identify a transition between operational states, wherein an output parameter from a previously applied battery cell equivalent model for estimating the charge state is provided as an input parameter for the subsequently applied battery cell equivalent model for estimating the charge state, and wherein the first, the second and the third battery cell equivalent model corresponds to a charge battery equivalent model, a discharge battery cell equivalent model and a relaxation battery cell equivalent model, respectively. This aspect of the present disclosure provides similar advantages as discussed above in relation to the previous aspect of the present disclosure.

The control unit may in one embodiment be an electronic control unit (ECU) is typically provided as an onboard component of the vehicle, the vehicle for example being a bus, a truck a car, or any form of construction equipment. The vehicle may furthermore be at least one of a pure electrical vehicle (PEV) and a hybrid electric vehicle (HEV).

According to a further aspect of the present disclosure there is provided a computer program product comprising a non-transitory computer readable medium having stored thereon computer program means for operating a battery management arrangement for a vehicle, the battery management arrangement comprising a control unit adapted to estimating a charge state for a battery cell, wherein the computer program product comprises, code for forming a first, a second and a third battery cell equivalent model for the battery cell, where the plurality of battery equivalent models relates to a first, a second and a third operational states for the battery cell, respectively, code for measuring an intermediate electrical current value of the battery cell, code for determining, based on the intermediate electrical current value, if the battery cell is in the first, the second or the third operational state for the battery cell, and code for estimating the charge state for the battery cell based on the battery cell equivalent model corresponding to the determined operational state, wherein the computer program product further comprises code for identifying a transition between operational states, wherein an output parameter from a previously applied battery cell equivalent model for estimating the charge state is provided as an input parameter for the subsequently applied battery cell equivalent model for estimating the charge state, and wherein the first, the second and the third battery cell equivalent model corresponds to a charge battery equivalent model, a discharge battery cell equivalent model and a relaxation battery cell equivalent model, respectively. Also this aspect of the present disclosure provides similar advantages as discussed above in relation to the previous aspects of the present disclosure.

The computer readable medium may be any type of memory device, including one of a removable nonvolatile random access memory, a hard disk drive, a floppy disk, a CD-ROM, a DVD-ROM, a USB memory, an SD memory card, or a similar computer readable medium known in the art.

Further advantages and advantageous features of the present disclosure are disclosed in the following description and in the dependent claims.

BRIEF DESCRIPTION OF THE DRAWINGS

With reference to the appended drawings, below follows a more detailed description of embodiments of the present disclosure cited as examples.

In the drawings.

DETAILED DESCRIPTION OF EXAMPLE EMBODIMENTS OF THE INVENTION

Figure 1A:
FIGS. 1A illustrates a truck and 1B a bus in which the battery management methodology according to the present disclosure may be incorporated.

The present disclosure will now be described more fully hereinafter with reference to the accompanying drawings, in which currently preferred embodiments of the present disclosure are shown. This disclosure may, however, be embodied in many different forms and should not be construed as limited to the embodiments set forth herein; rather, these embodiments are provided for thoroughness and completeness, and fully convey the scope of the disclosure to the skilled addressee. Like reference characters refer to like elements throughout.

Figure 1B:
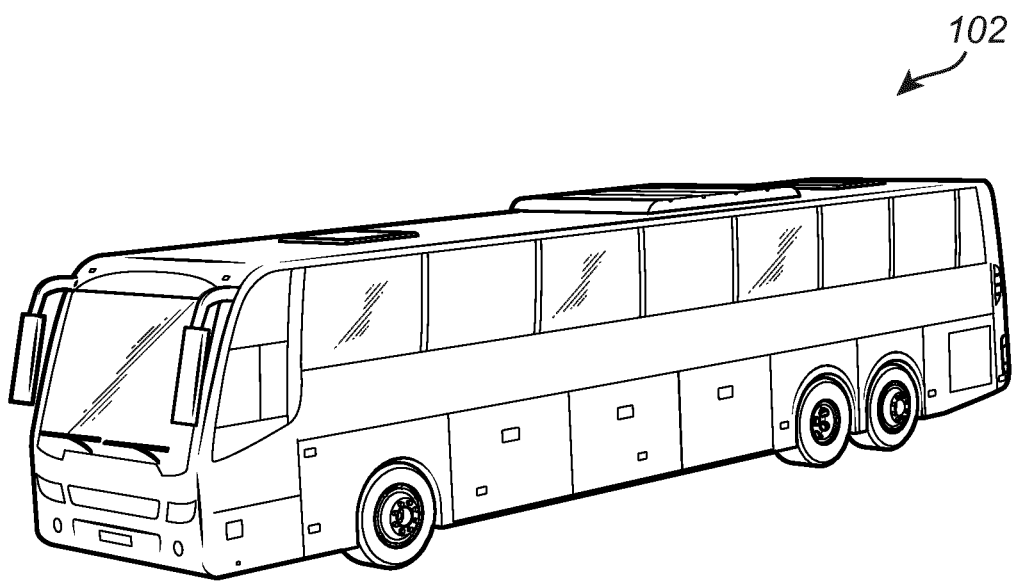

Referring now to the drawings and to FIG. 1A in particular, there is depicted an exemplary vehicle, here illustrated as a truck 100, in which the battery management methodology according to the present disclosure may be incorporated. The battery management methodology may of course be implemented, possibly in a slightly different way, in a bus 102 as shown in FIG. 1B, a car, etc. The vehicle may for example be one of an electric or a hybrid vehicle. The vehicle comprises an electric machine in case of being either of an electric or hybrid vehicle for propelling the vehicle.

Figure 2:
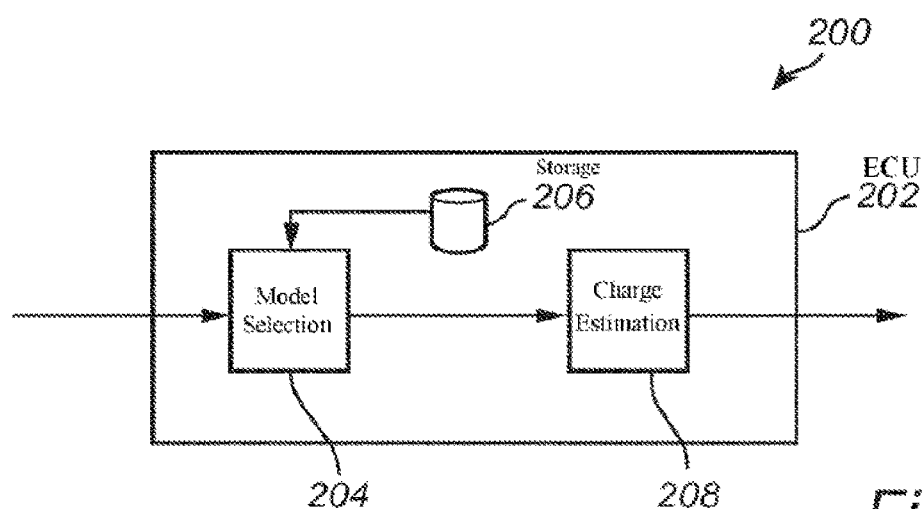
FIG. 2 illustrates a conceptual battery management arrangement for performing charge state estimation in accordance to a currently preferred embodiment of the present disclosure.

In FIG. 2 there is shown a battery management arrangement 200, comprising a control unit, such as an electronic control unit (ECU) 202, for battery charge state estimation. The ECU 202 is adapted to receive an indication of a measured electrical current (such as from a current sensor sampling/measuring an intermediate electrical current of the battery cell, not explicitly shown) and to provide the same to a model selection component 204, where a process for identifying a current operational state for the battery cell is performed. The ECU 202 is further provided with a storage component 206 adapted to store a plurality of battery equivalent models as will be further discussed in relation to FIGS. 3A and 3B. In addition, the ECU 202 comprises a battery charge state estimation module 208, adapted to estimate a charge state for the battery cell based on a currently selected battery cell equivalent model matching the current operational state for the battery cell, as will be further elaborated in relation to FIG. 4.

The ECU 202 may for example be manifested as a general-purpose processor, an application specific processor, a circuit containing processing components, a group of distributed processing components, a group of distributed computers configured for processing, a field programmable gate array (FPGA), etc. The processor may be or include any number of hardware components for conducting data or signal processing or for executing computer code stored in memory. The memory may be one or more devices for storing data and/or computer code for completing or facilitating the various methods described in the present description. The memory may include volatile memory or nonvolatile memory. The memory may include database components, object code components, script components, or any other type of information structure for supporting the various activities of the present description. According to an exemplary embodiment, any distributed or local memory device may be utilized with the systems and methods of this description. According to an exemplary embodiment the memory is communicably connected to the processor (e.g., via a circuit or any other wired, wireless, or network connection) and includes computer code for executing one or more processes described herein.

In accordance to the present disclosure, the battery management arrangement, 200, may form part of a battery system (not explicitly shown), further including a battery comprising a plurality of battery cells.

Figure 3A:
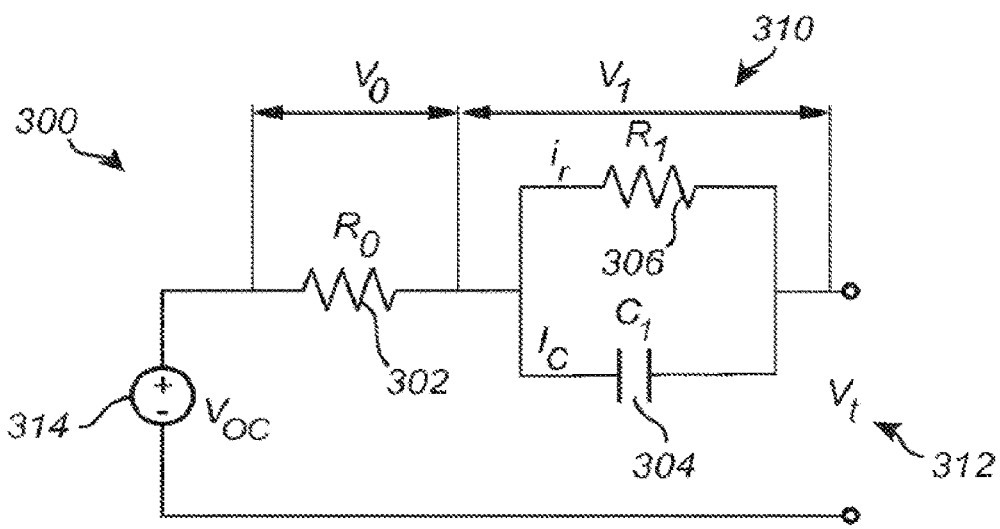
FIGS. 3A and 3B shows different exemplary RC based circuit model for charge state estimation for the battery cell for use in conjunction with the battery management arrangement as shown in FIG. 2.
Figure 3B:
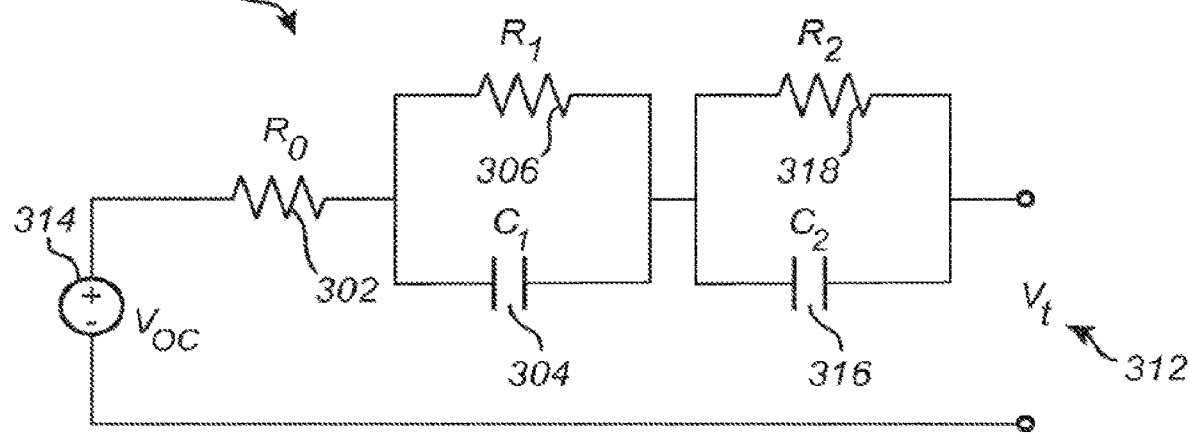

FIGS. 3A and 3B shows different exemplary RC based circuit model for charge state estimation for the battery cell, typically implemented by the above mentioned battery charge state estimation module 208. As will be elaborated further below, circuit models with different orders may be used for different operational states for the battery. The exemplified (equivalent) circuit models illustrated in e.g. FIGS. 3A and 3B are used for estimating the charge state (e.g. SOC or SOE) for the battery cell. To achieve a desirable (high) reliability of the estimated charge state it is, as indicated above, desirable to select different circuit models for different operational states of the battery.

A battery management arrangement 200 based on different RC circuit models for different operational states provides sufficient computation speed manageable without introducing additional hardware and/or increasing the system complexity. The characterization of the battery cell may accordingly be calculated by real-time parameter estimation approaches on battery models using direct battery measurements. The battery cell charge state estimation may for example be based on measured battery current inputs and a battery terminal voltage.

FIG. 3A is a schematic of an exemplary circuit model 300 comprising a single RC circuit to model (1 RC) a battery cell, typically implemented by the battery charge state estimation module 204, according to a first embodiment. The circuit may model a battery including a battery pack and/or one or more battery cells. The equivalent circuit model consists of an active electrolyte resistance (or internal resistance) $R_0$, 302, in series with the parallel capacitance $C_1$, 304, and an active charge transfer resistance $R_1$, 306. The battery dynamics and related state variables are expressed as the terminal voltage output $v_t$, 312, the battery open circuit voltage $v_{OC}$, 314, the voltage of the internal resistance $v_0$ and the voltage of the RC circuit $v_1$, 310. The mentioned state variables, etc. are typical examples of output parameters for forward from a previous to a future operational state.

As an alternative, in FIG. 3B there is shown a schematic of an exemplary schematic circuit model 315 comprising two RC circuits (2 RC) to model a battery cell according to a second embodiment. The two RC circuits may improve the modeling of the battery cell, in regards to some operational states for the battery cell. The circuit model 315 specifically includes an additional RC circuit having a capacitor $C_2$, 316, and a resistor R2, 318, in parallel of each other and in series with the RC circuit in the equivalent circuit model 300 as illustrated in FIG. 3A. Further, alternative, circuit models may have other configurations not limited to one or two RC circuits. Accordingly, the selected battery cell equivalent model stored by the storage component 206 and used by the battery charge state estimation module 208 may include, but is not limited to, two or more RC circuits to model the battery cell.

Figure 4:
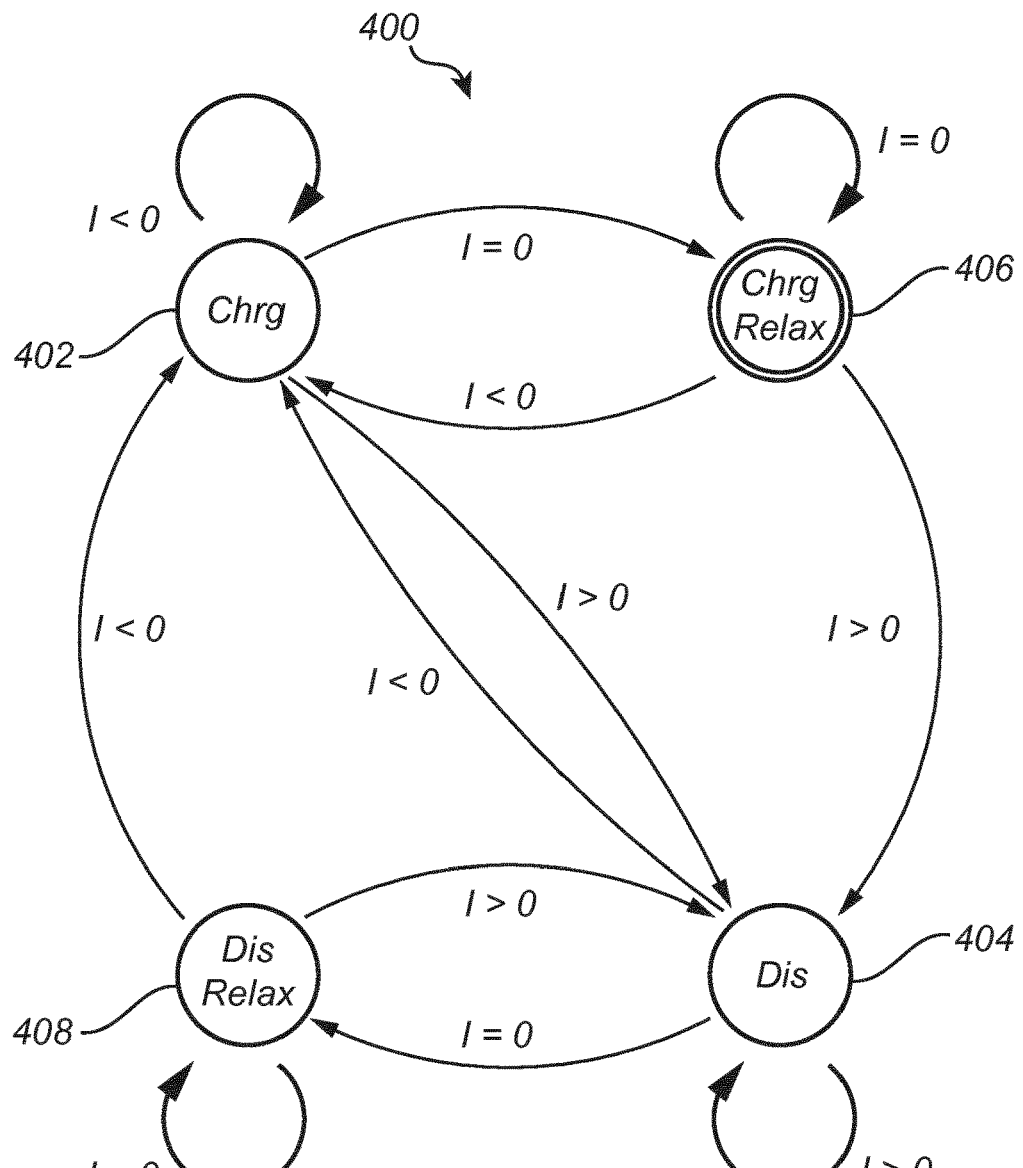
FIG. 4 is a state machine implemented by the battery management arrangement as shown in FIG. 2.

FIG. 4 illustrates a state diagram (state machine) 400 that can be executed on ECU 202 for battery cell charge state estimation. The disclosed state machine 400 defines four separate operational states for the battery cell, namely a charge state 402, a discharge state 404, a charge relaxation state 406 and a discharge relaxation state 408.

During the charge state 402, power is supplied from either a generator or power source, through a rectifier and into the battery cell. Similarly, during the discharge state 404, power is supplied from the battery cell to e.g. the electric machine comprised with the vehicle 100, 102. The charge relaxation state 406 is an intermediate state following a situation where the battery cell has been in the charge state 402 but not residing on the discharge state 404. Similarly, the discharge relaxation state 408 is an intermediate state following a situation where the battery cell has been in the discharge state 404 but not residing on the charge state 402.

As discussed above, the different states 402, 404, 406 and 408 have defined corresponding battery equivalent models defined based on e.g. an RC circuit model as shown in relation to FIGS. 3A and 3B. In an exemplary implementation, a lower order circuit model is selected for the charging/discharging operational states 402/404 as compared to the relaxation operational states 406, 408. Accordingly, in an exemplary embodiment of the present disclosure an 1 RC model such as shown in FIG. 3A is applied for battery charge state estimation in relation to the charging/discharging operational states 402/404, and a 2 RC model such as shown in FIG. 3B is applied for battery charge state estimation in relation to the relaxation operational states 406, 408. In accordance to the present disclosure, it has been identified that during battery cell charging and discharging, a 1 RC model will possibly give similar results as a 2 RC. A 2 RC model may possibly provide an overfit in the battery cell charge estimation. Additionally, a further plurality of parameters are needed to be stored when using a 2 RC based model. Still further, a 2 RC based model will generally need more computational power to execute.

The state machine 400 will reside in one specific state as long as e.g. the measured intermediate electrical current is above, below or at zero, depending on the current state. Thus, if for example the state machine 400 is within the charging state 402 and the measured current is negative (i.e. whereby electrical power is generated by the electrical machine), the battery cell charge estimation made will be made based upon the 1 RC model (FIG. 3A), if in accordance to the example above. However, if the model selection component 204 identifies that the measured electrical current becomes essentially zero but not positive, this is identified as a transition from the charge state 402 to the charge relaxation state 406. Once in the charge relaxation state 406, the model selection component 204 will retrieve a battery equivalent model relating to the charge relaxation state 406 stored by the storage component 206. In accordance to the present example, the 2 RC model (FIG. 3B) will be selected for battery charge state estimation as long as the state machine 400 resides in the charge relaxation state 406.

In line with the present disclosure, an output parameter from a previously applied battery cell equivalent model (in this case the 1 RC model) for estimating the charge state may be provided as an input parameter for a subsequently applied battery cell equivalent model (in this case the 2 RC model) for estimating the charge state. It may for example be possible to allow the voltages of the RC branched of the previous state to be used to calculate the initial values of the RC voltages of the next state. By doing so, the convergence time needed for the battery charge state estimation could be reduced, as compared to e.g. if the next model is initialized with zero RC voltages, as is a common assumption (equivalent to fully discharged capacitors in the RC model). In addition, during the transition between the selected battery equivalent model (corresponding to the present operational state) with different number of RC branches, it may be possible to use the voltages of the RC branches of the previous model for determining an initial value for the RC voltage of the subsequently used battery equivalent model.

Figure 5:
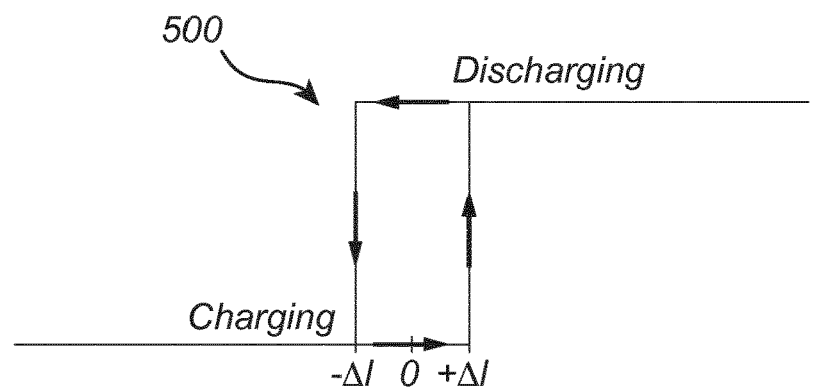
FIG. 5 is a diagram illustrating a possible implementation of the hysteresis functionality for use in relation to the transition between operational states.

This functionality may also allow for the implementation of a hysteresis functionality, as exemplified by the hysteresis diagram 500 as shown in FIG. 5, whereby the transition from the previous battery equivalent model to the subsequent battery equivalent model may be refrained from or at least delayed. As mentioned above, the hysteresis functionality may be adapted such that switching between different battery cell equivalent models is at (exact) zero, possibly with a predefined tolerance (e.g. between $+\Delta I$ and $-\Delta I$).

Specifically, by implementing e.g. the hysteresis functionality as shown in FIG. 5, around zero current, the operational states (and thus the corresponding models) will not be switching actively. In the simplest implementation, the conditions depicted in the state machine 400 could be replaced by:

| Original state transition condition | New state transition condition | Operational state |
|---|---|---|
| $I = 0$ | $I$ in $[-\Delta I, \Delta I]$ | Relaxation |
| $I > 0$ | $I > +\Delta I$ | Discharging |
| $I < 0$ | $I < -\Delta I$ | Charging |

The hysteresis functionality may be extended for providing additional robustness by introducing further hysteresis levels around $+\Delta I$ and $-\Delta I$ to avoid switching around those levels. For example with two thresholds $\Delta I1$ and $\Delta I2$, it may be possible to further reduce the number of transitions around the charging state and the charging relaxation state, as well as around the discharging state and the discharging relaxation state.

Further to the above example as shown in FIG. 4, the state machine 400 may transition from the charge relaxation state 406 back to the charging state 402 or instead to the discharging state 404. A transition to the discharging state 404 will take place in case the intermediately measured electrical current is determined to be positive (meaning that power is supplied from e.g. the mentioned generator or power source). Conversely, in case the intermediately measured electrical current is determined to be negative a transition will be made back to the charging state 402.

From the discharging state 404, the state machine 400 may transition to either of the charge state 402 (negative current) or the discharge relaxation state 408 (current=0). In line with the above discussion, the discharging state 404 will typically apply the 1 RC model, whereas the discharging relaxation state 408 will apply the 2 RC model.

Finally and further to the discussion above, it may in some embodiment of the present disclosure be desirable to make special considerations during the transitions between the different battery cell models. First, in the case of a transition from the 2 RC model to the 1 RC model, the sum of the voltages in the 2 RC branches is considered the initial value for the voltage of the 1 RC:

$$v_{RC1\_model1} = v_{RC1\_model2} + v_{RC1\_model2}$$

Secondly, during a transition from the 1 RC model to the 2 RC model, the voltage of the 1 RC model is divided in a certain proportion between the 2 RC branches to be used as initial values. The proportion of the division is denoted as $v_{rate}$:

$$v_{RC1\_model2} = v_{RC1\_model1} * v_{rate}$$

$$v_{RC2\_model2} = v_{RC1\_model1} * (1 - v_{rate})$$

In some embodiments the $v_{rate}$ may also be allowed to depend on the battery cell charge state and a battery cell temperature (possibly measured using a temperature sensor connected to the ECU 202), and the values of $v_{rate}$ are stored in a map:

$$v_{rate} = \text{function}(SOC, \text{Temperature})$$

Figure 6:
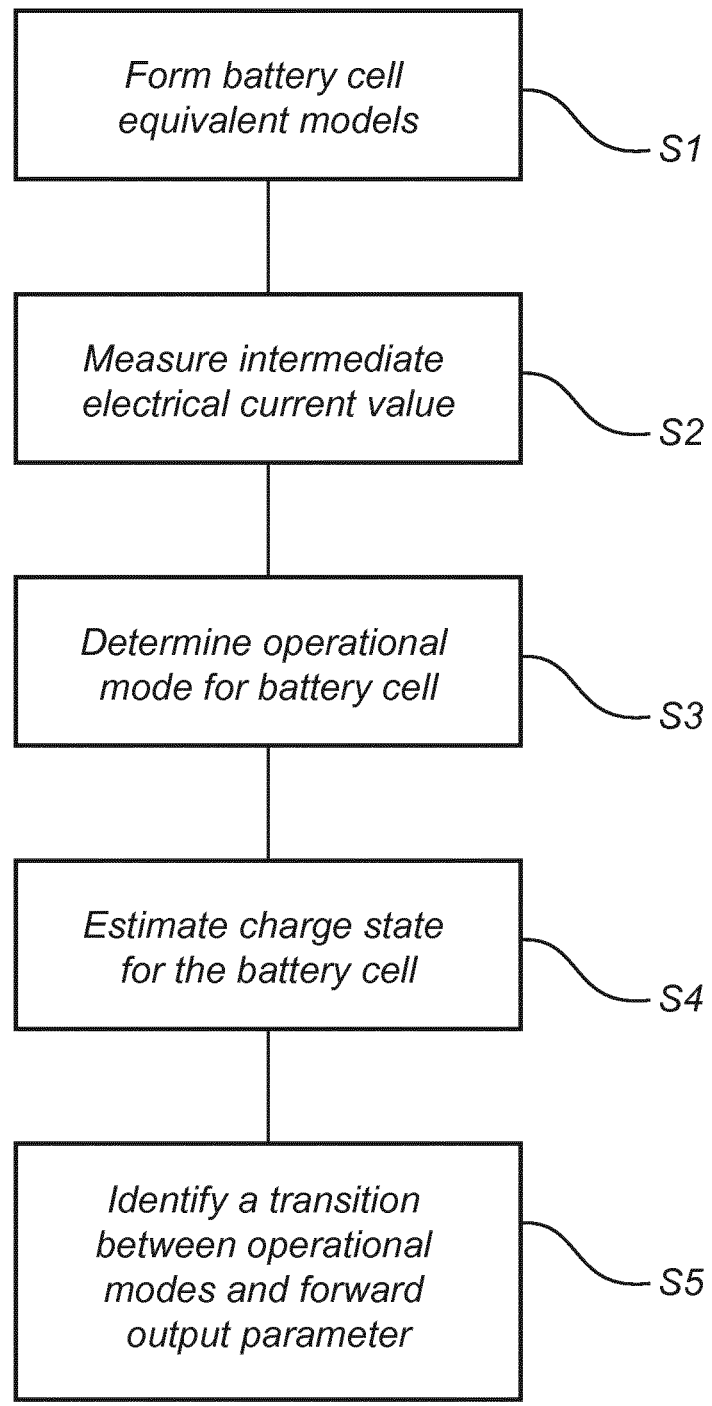
FIG. 6 illustrates the processing steps for performing the method according to the present disclosure.

To summarize, the present disclosure relates to a computer-implemented method of estimating a charge state for a battery cell, as illustrated by the flow chart of FIG. 6. The method comprises the steps of forming S1 a first, a second and a third battery cell equivalent model for the battery cell, where the plurality of battery equivalent models relates to a first 402, a second 404 and a third 406, 408 operational states for the battery cell, respectively, measuring S2 an intermediate electrical current value of the battery cell, determining S3, by the control unit 202 and based on the intermediate electrical current value, if the battery cell is in the first 402, the second 404 or the third 406, 408 operational state for the battery cell, and estimating S4, by the control unit 202, the charge state for the battery cell based on the battery cell equivalent model corresponding to the determined operational state, wherein the method further comprises identifying S5, by the control unit 202, a transition between operational states 402, 404, 406, 408, wherein an output parameter from a previously applied battery cell equivalent model for estimating the charge state is provided as an input parameter for a subsequently applied battery cell equivalent model for estimating the charge state.

Advantages with the present disclosure include the possibility to achieve, in comparison to prior-art, a quick formation of a relatively accurate charge state estimation for the battery. This is specifically advantageous in cases where the battery is expected to frequently transition between different operational state, such as for example in an automotive implementation.

The present disclosure contemplates methods, devices and program products on any machine-readable media for accomplishing various operations. The embodiments of the present disclosure may be implemented using existing computer processors, or by a special purpose computer processor for an appropriate system, incorporated for this or another purpose, or by a hardwired system. Embodiments within the scope of the present disclosure include program products comprising machine-readable media for carrying or having machine-executable instructions or data structures stored thereon. Such machine-readable media can be any available media that can be accessed by a general purpose or special purpose computer or other machine with a processor. By way of example, such machine-readable media can comprise RAM, ROM, EPROM, EEPROM, CD-ROM or other optical disk storage, magnetic disk storage or other magnetic storage devices, or any other medium which can be used to carry or store desired program code in the form of machine-executable instructions or data structures and which can be accessed by a general purpose or special purpose computer or other machine with a processor. When information is transferred or provided over a network or another communications connection (either hardwired, wireless, or a combination of hardwired or wireless) to a machine, the machine properly views the connection as a machine-readable medium. Thus, any such connection is properly termed a machine-readable medium. Combinations of the above are also included within the scope of machine-readable media. Machine-executable instructions include, for example, instructions and data that cause a general-purpose computer, special purpose computer, or special purpose processing machines to perform a certain function or group of functions.

Although the figures may show a specific order of method steps, the order of the steps may differ from what is depicted. In addition, two or more steps may be performed concurrently or with partial concurrence. Such variation will depend on the software and hardware systems chosen and on designer choice. All such variations are within the scope of the disclosure. Likewise, software implementations could be accomplished with standard programming techniques with rule-based logic and other logic to accomplish the various connection steps, processing steps, comparison steps and decision steps. Additionally, even though the disclosure has been described with reference to specific exemplifying embodiments thereof, many different alterations, modifications and the like will become apparent for those skilled in the art.

Variations to the disclosed embodiments can be understood and effected by the skilled addressee in practicing the claimed disclosure, from a study of the drawings, the disclosure, and the appended claims. Furthermore, in the claims, the word "comprising" does not exclude other elements or steps, and the indefinite article "a" or "an" does not exclude a plurality.

The invention claimed is:

1. A computer-implemented method of estimating a charge state for a battery cell comprised with a vehicle, the vehicle comprising a battery management arrangement which comprises a control unit, the method comprising:

forming a first, a second and a third battery cell equivalent models for the battery cell, where the plurality of battery equivalent models relate to a first, a second and a third operational states for the battery cell, respectively;

measuring an intermediate electrical current value of the battery cell;

determining, by the control unit and based on the intermediate electrical current value, if the battery cell is in the first, the second or the third operational state for the battery cell;

estimating, by the control unit, the charge state for the battery cell based on the battery cell equivalent model corresponding to the determined operational state; and identifying, by the control unit, a transition between operational states, wherein an output parameter from a previously applied battery cell equivalent model for estimating the charge state is provided as an input parameter for a subsequently applied battery cell equivalent model for estimating the charge state, wherein:

the first, the second and the third battery cell equivalent models correspond to a charge battery equivalent model, a discharge battery cell equivalent model and a relaxation battery cell equivalent model, respectively, each of the battery equivalent models for the battery cell is represented by a circuit model, and each of the circuit models is an RC based circuit model.

2. The method according to claim 1, wherein the charge state is at least one of a state of charge (SOC) and a state of energy (SOE).

3. The method according to claim 1, wherein a provision of the output parameter from the previously applied battery cell equivalent model as the input parameter for the subsequently applied battery cell equivalent model provides for hysteresis in the transition between operational states.

4. The method according to claim 1, wherein the output/input parameter is based on an electrical current value for the battery cell.

5. The method according to claim 1, wherein the RC based circuit model for the relaxation battery cell equivalent model is of a higher order as compared to the RC based circuit models for the charge battery equivalent model and the discharge battery cell equivalent model.

6. The method according to claim 1, wherein each of the battery equivalent models for the battery cell is different from each other.

7. The method according to claim 1, further comprising: estimating an intermediate temperature of the battery cell.

8. The method according to claim 7, further comprising: determining a proportion rate based on the estimated charge state and the estimated temperature, and using the proportion rate in relation to the subsequently applied battery cell equivalent model for estimating the charge state.

9. The method according to claim 1, wherein the first, the second and the third operational states for the battery cell are arranged as a state machine.

10. The method according to claim 9, further comprising determining if the battery cell is in a fourth operational state for the battery cell and forming a corresponding fourth battery cell equivalent model.

11. The method according to claim 10, wherein the third operational state corresponds to a charge relaxation battery cell equivalent model and the fourth operational state corresponds to a discharge relaxation battery cell equivalent model.

12. A battery management arrangement for a vehicle, comprising a control unit adapted to estimating a charge state for a battery cell, wherein the control unit is configured to:

form a first, a second and a third battery cell equivalent models for the battery cell, where the battery equivalent models relate to a first, a second and a third operational states for the battery cell, respectively;

measure an intermediate electrical current value of the battery cell;

determine, based on the intermediate electrical current value, if the battery cell is in the first, the second or the third operational state for the battery cell;

estimate the charge state for the battery cell based on the battery cell equivalent model corresponding to the determined operational state;

identify a transition between operational states, wherein an output parameter from a previously applied battery cell equivalent model for estimating the charge state is provided as an input parameter for a subsequently applied battery cell equivalent model for estimating the charge state;

wherein the first, the second and the third battery cell equivalent models correspond to a charge battery equivalent model, a discharge battery cell equivalent model and a relaxation battery cell equivalent model, respectively, each of the battery equivalent models for the battery cell is represented by a circuit model, and each of the circuit models is an RC based circuit model.

13. The battery management arrangement according to claim 12, wherein the charge state is at least one of a state of charge (SOC) and a state of energy (SOE).

14. A vehicle comprising the battery management arrangement according to claim 12.

15. The vehicle according to claim 14, wherein the vehicle is at least one of a pure electrical vehicle (PEV) and a hybrid electric vehicle (HEV).

16. A computer-implemented method of estimating a charge state for a battery cell comprised with a vehicle, the vehicle comprising a battery management arrangement which comprises a control unit, the method comprising:

forming a first, a second and a third battery cell equivalent models for the battery cell, where the battery equivalent models relate to a first, a second and a third operational states for the battery cell, respectively;

measuring an intermediate electrical current value of the battery cell;

determining by the control unit and based on the intermediate electrical current value, if the battery cell is in the first, the second or the third operational state for the battery cell;

estimating, by the control unit, the charge state for the battery cell based on the battery cell equivalent model corresponding to the determined operational state; and identifying, by the control unit, a transition between operational states, wherein an output parameter from a previously applied battery cell equivalent model for estimating the charge state is provided as an input parameter for a subsequently applied battery cell equivalent model for estimating the charge state, wherein:

the first, the second and the third battery cell equivalent models correspond to a charge battery equivalent model, a discharge battery cell equivalent model and a relaxation battery cell equivalent model, respectively, wherein the method further comprises:

estimating an intermediate temperature of the battery cell, determining a proportion rate based on the estimated charge state and the estimated temperature, and using the proportion rate in relation to the subsequently applied battery cell equivalent model for estimating the charge state.

* * * * *